United States Patent [19]
Bird et al.

[11] Patent Number: 6,054,746
[45] Date of Patent: Apr. 25, 2000

[54] IMAGE SENSOR AND ITS MANUFACTURE

[75] Inventors: Neil C. Bird, Horley; Ian D. French, Hove, both of United Kingdom; Brian P. McGarvey, Ballinasloe, Ireland

[73] Assignee: U.S. Philips Corporation, New York, N.Y.

[21] Appl. No.: 09/082,448

[22] Filed: May 20, 1998

[30] Foreign Application Priority Data

May 21, 1997 [GB] United Kingdom .................. 9710301

[51] Int. Cl.⁷ ...................... H01L 31/075; H01L 31/105; H01L 31/117
[52] U.S. Cl. .......................... 257/458; 257/448; 257/459; 257/461
[58] Field of Search .................... 257/448, 458, 257/459, 461

[56] References Cited

U.S. PATENT DOCUMENTS

| | | | |
|---|---|---|---|
| 4,797,560 | 1/1989 | Berger et al. ........................ | 250/578 |
| 5,097,120 | 3/1992 | Kitamura et al. .................... | 250/208.1 |
| 5,132,541 | 7/1992 | Conrads et al. ..................... | 250/370 |
| 5,753,960 | 5/1998 | Dickmann ............................ | 257/458 |

OTHER PUBLICATIONS

"An Ohmic Contact Formation Method for Fabricating a SI TFT's on Large Size Substrate", by T. Yukawa et al., Proceedings of the 9th International Display Research Conference, Oct. 16–18, 1989, Japan Display '89, pp. 506–509.

Primary Examiner—Ngân V. Ngô
Attorney, Agent, or Firm—Tony E. Piotrowshi

[57] ABSTRACT

An image sensor comprising an array of pixels 2, each pixel 2 including a pin or nip photodiode P. At least the intrinsic semiconductor layer of the photodiodes of a group of pixels is shared between those pixels and acts as a barrier to reduce edge leakage currents. A group of pixels may be a row of pixels, or may be all pixels of the array.

10 Claims, 5 Drawing Sheets

IMAGE SENSOR AND ITS MANUFACTURE

BACKGROUND OF THE INVENTION

This invention relates to image sensors, particularly of the type comprising an array of pixels, and each pixel including a photo-responsive diode. The invention also relates to a method of manufacturing such an image sensor.

There is currently much interest in reducing the manufacturing complexity of an image sensor array. For example, an improved yield is obtained if the number of processing steps required for the manufacture of the array is reduced. In the case of an array of pixels formed using thin-film technology, the number of accurate masks which are required in the manufacturing process is of particular importance.

These issues have lead to an interest in diode-based pixel configurations. For example, a known pixel configuration comprises a photodiode and a switching diode in series between respective row and column conductors. There have also been proposals to fabricate a stacked pixel configuration, such as shown in U.S. Pat. No. 4,797,560 which simplifies the mask patterns, and enables a high resolution image sensor to be fabricated.

One problem encountered with thin film diodes is the edge leakage current between the n-type semiconductor and p-type semiconductor material across the edge of the diode structure. This leakage current becomes increasingly significant as the dimensions of the individual pixels are reduced.

This invention seeks to reduce further the complexity of manufacturing a diode-based image sensor array, and also seeks to address the problem of edge leakage current effects in thin film diodes.

SUMMARY OF THE INVENTION

According to the invention, there is provided an image sensor comprising an array of photoresponsive pixels provided on a common substrate, each pixel comprising a photodiode having a first semiconductor region of first doping type, an intrinsic semiconductor region over the first semiconductor region, and a second semiconductor region of second, opposite, doping type, over the intrinsic semiconductor region, characterised in that the intrinsic semiconductor region extends between photodiodes within a group of pixels.

In the description and claims, any reference to each pixel having an associated photodiode should be understood in the context of photodiode layers being shared between pixels. The photodiode of a pixel comprises the photodiode layers over a region of the substrate corresponding to the respective pixel.

There have been proposals to share a semiconductor layer between pixels of a photoconductor type sensor matrix, in which photoconductive semiconductor material is sandwiched between pixel electrodes. U.S. Pat. No. 5,132,541 discloses an arrangement of this type.

In the image sensor of the invention, the intrinsic semiconductor layer of the photodiodes of a group of pixels is shared between those pixels. The shared intrinsic semiconductor layer provides a barrier between the n-type and p-type (the two opposite doping types) semiconductor material because this shared layer extends beyond the edges of the pixel photodiodes. Edge leakage currents are thereby reduced, and, simplified patterning of the semiconductor layer is made possible.

Each pixel may comprise a switching diode and a photodiode, with the switching diode and photodiode occupying separate areas over the substrate. The intrinsic semiconductor layer may then extend between photodiodes within a row of pixels. The intrinsic semiconductor layer may therefore be provided over a respective row conductor, and the area occupied by each pixel within the row may be maximised. Preferably, the first and second semiconductor regions also extend between adjacent photodiodes within a row of pixels. The entire diode structure may then be patterned using a single mask during the thin-film etching process.

The intrinsic semiconductor layer may alternatively extend between the photodiodes of all pixels of the array. This simplifies further the patterning of the semiconductor layer. Preferably, the second semiconductor region of the photodiodes of one column of pixels is separate from the second semiconductor region of the photodiodes of each other column of pixels. This reduces cross-talk between the columns of pixels. In this way, the second semiconductor region of the photodiodes may be patterned using the column conductors associated with the columns of pixels.

The intrinsic semiconductor region may be partially etched so that an upper portion of the intrinsic semiconductor region is patterned to correspond to the second semiconductor regions, and a lower portion of the intrinsic semiconductor region extends between the photodiodes of all pixels of the array. This partial etching of the intrinsic semiconductor region enables additional isolation between columns of pixels but also maintains the advantage of reducing edge leakage currents within the pixel photodiodes.

Preferably, each pixel comprises a bottom contact, the photodiode being disposed over the bottom contact, and a capacitor disposed over the photodiode, the capacitor having the same shape as and overlying the second semiconductor region of each pixel. The capacitor may then be etched using the same mask as for the second semiconductor region of each pixel, and this mask may effectively comprise the column conductors.

The capacitor preferably comprises a dielectric layer disposed over the second semiconductor region of each pixel, and a top contact over the dielectric layer. In this way, there is no metallic contact between the photodiode structure and the capacitor dielectric, which would otherwise interconnect the photodiodes within each column of pixels. Instead, the lateral conduction within the doped second semiconductor region is sufficiently low such that the photodiodes within each column are isolated from each other.

The image sensor may comprise a pixel area and a peripheral circuitry area, the capacitors being formed only over the pixel area. Thus, diodes are formed in the peripheral circuitry area, which enables diode-based control circuits to be formed. An area may be provided between the pixel area and the peripheral circuitry area without photodiode or capacitor layers which enables access to the base contacts, and top contacts then define connections between the diodes in the peripheral circuitry.

When the pixel photodiodes of the invention are formed using a preferred method, the photodiode comprises an intrinsic amorphous silicon layer disposed over a doped bottom conductor, the doped conductor thereby forming doped regions in the intrinsic layer which define semiconductor regions of a first doping type, and a semiconductor layer of second, opposite, doping type over the intrinsic semiconductor layer. In this way, patterning of the first semiconductor layer is not required, since the first doping type regions are formed only at the locations of the doped conductors.

The invention also provides a method of manufacturing an image sensor comprising an array of pixels, each comprising a respective photodiode, the method comprising:

depositing a conductive bottom contact layer over an insulating substrate, and patterning the contact layer with a first etching step;

depositing semiconductor layers and a capacitor dielectric layer over the patterned bottom contact layer to define a photodiode-capacitor pixel structure over the entire array; and depositing a top contact layer over the semiconductor and capacitor dielectric layers, and patterning the top contact layer with a second etching step.

In the method of invention, there are only two essential etching steps required to fabricate the pixel array.

The photodiode layers are preferably provided over the patterned bottom contact layer, and the capacitor dielectric layer is provided over the photodiode layers.

The semiconductor layers may comprise a bottom layer of first doping type, an intrinsic layer, and a top layer of second, opposite, doping type. Alternatively, the patterned bottom contact layer may be doped, and the semiconductor layers then comprise only an intrinsic semiconductor layer and a top layer of the second doping type, the doping of the bottom contact layer giving rise to local doping of the intrinsic semiconductor layer over the patterned bottom contact layer. In either case, the capacitor dielectric layer may be etched with a third etching step using the patterned top contact layer as a mask. This etching step is therefore self-aligned and does not introduce any additional mask alignment problems. This third etching step may also be used to etch into the intrinsic semiconductor layer so that a portion of the intrinsic layer is removed.

BRIEF DESCRIPTION OF THE DRAWINGS

The invention will now be described by way of example, with reference to the accompanying drawings, in which.

DESCRIPTION OF THE PREFERRED EMBODIMENTS

Figure 1:
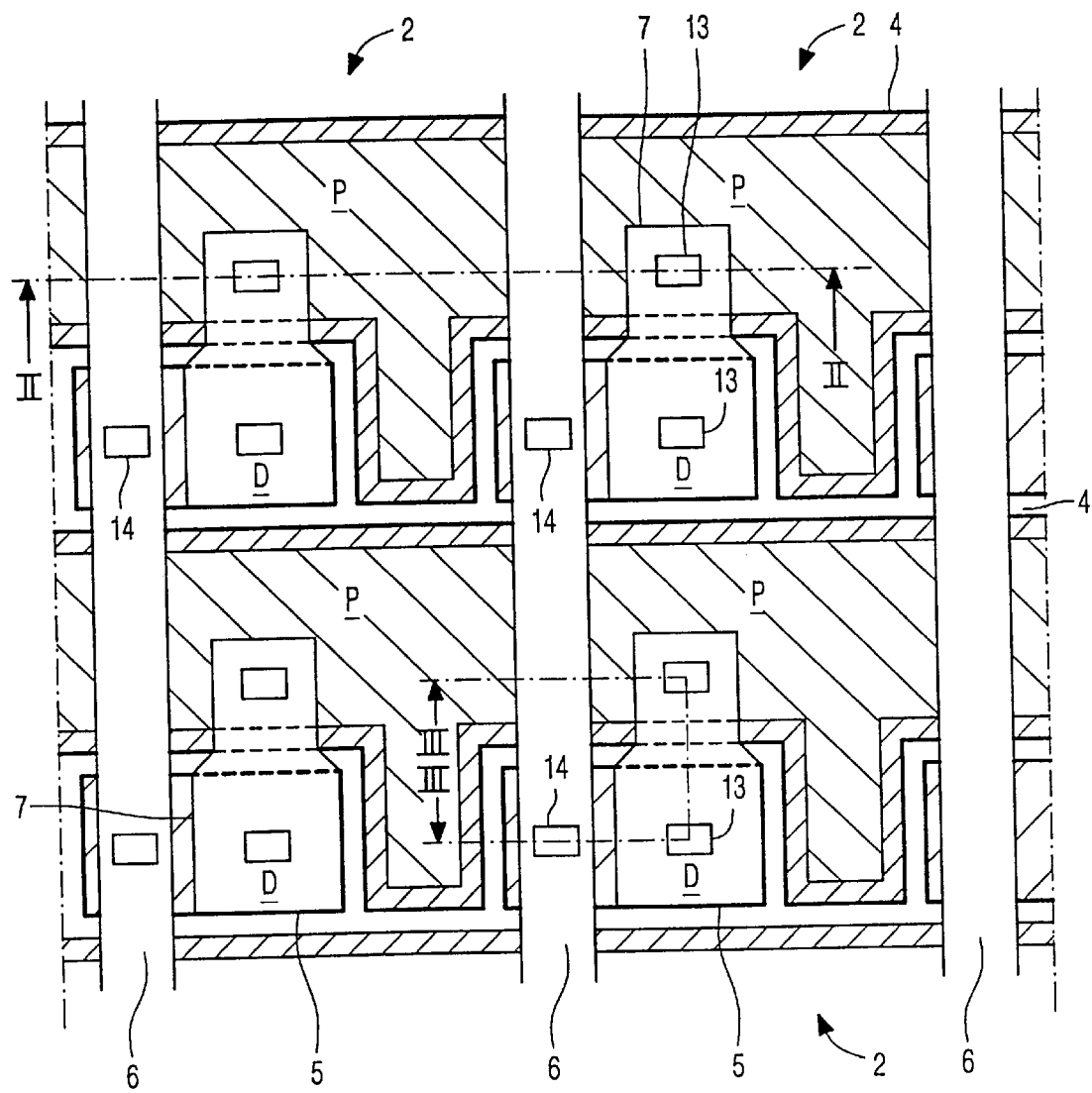
FIG. 1 shows a plan view of a first embodiment of an image sensor according to the invention.

FIG. 1 shows, in plan view, a first embodiment of an image sensor pixel structure according to the invention. The image sensor comprises rows and columns of pixels 2 having associated row and column conductors 4, 6. The pixels 2 are addressed by row pulses applied to the row conductors 4 by a row driver circuit, not shown. Signals are read out from the pixels 2 by means of the associated column conductor 6 using a column reading circuit, also not shown. Those skilled in the art will appreciate the different techniques for operating an image sensor, and a detailed description of the possible operating schemes will not be given.

The pixels 2 are formed on a common substrate and together form a pixel array. Furthermore, portions of the row driver circuit and/or the column reading circuit may also be formed on the common substrate. For example, either circuit may include multiplexers, electrostatic protection diodes, or modulating circuits, which may be integrated onto the substrate of the pixel array.

Various pixel configurations are known, and in the pixel array shown in FIG. 1, each image sensor pixel 2 comprises a photosensitive diode P and a switching diode D connected in series between a respective row conductor 4 and column conductor 6.

In accordance with the invention, the example of FIG. 1 shows the layers defining the photodiodes P to be shared between all pixels in each row. In this way, the photodiode area of each pixel may be maximised to improve the light collecting efficiency of the image sensor pixels. Each pixel has its own respective switching diode D, one terminal of which makes contact with the top of the photodiode layers, and the other terminal of which makes contact with the overlying column conductor 6.

Interference between pixels within a row is limited by virtue of the high resistance of the amorphous silicon layers defining the photodiode structure. As a result, the charge localisation within each pixel area prevents interference between charges stored on pixels within a row.

Figure 2:
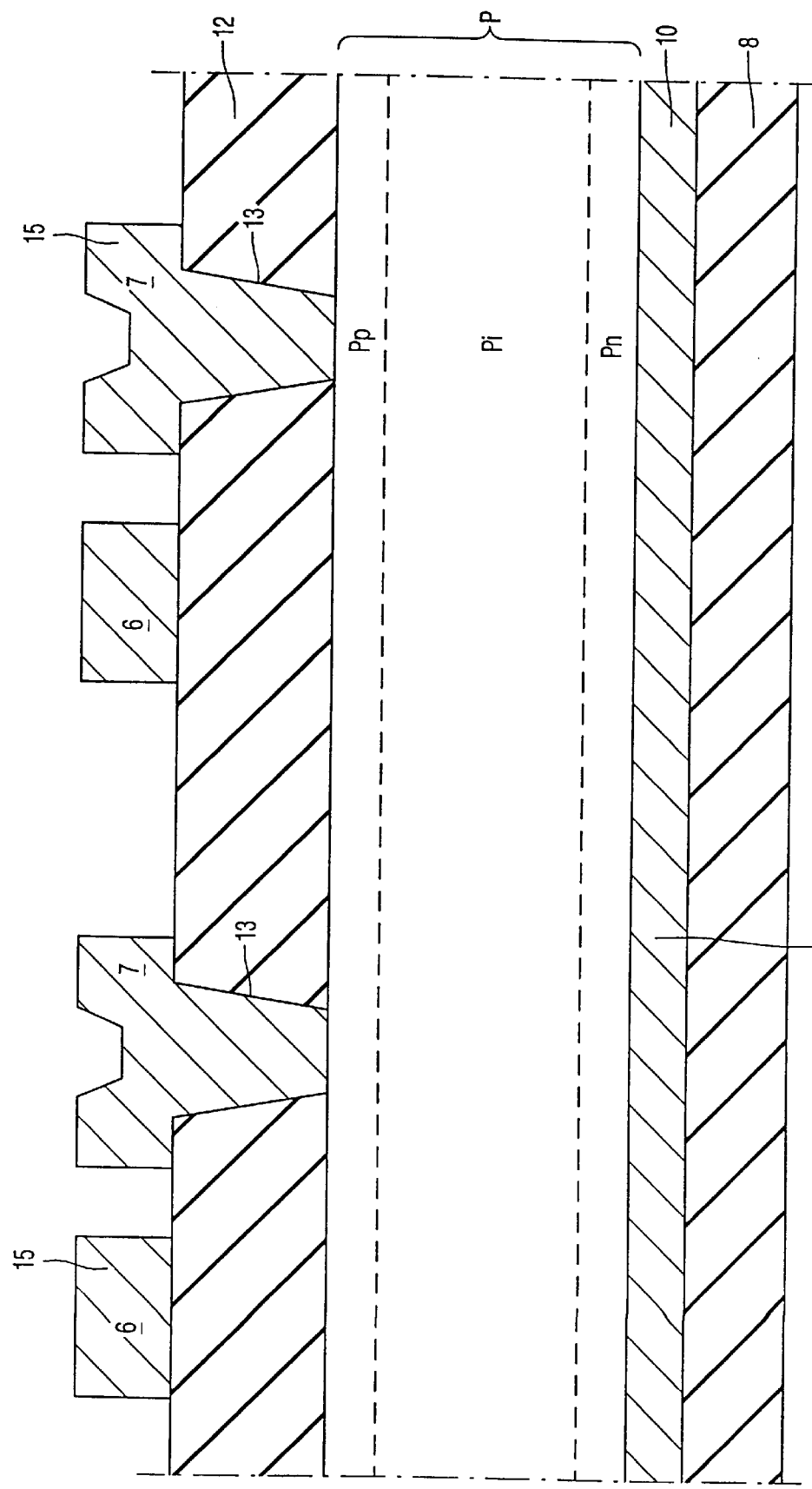
FIG. 2 shows a cross section along the line 2—2 in FIG. 1.
Figure 3:
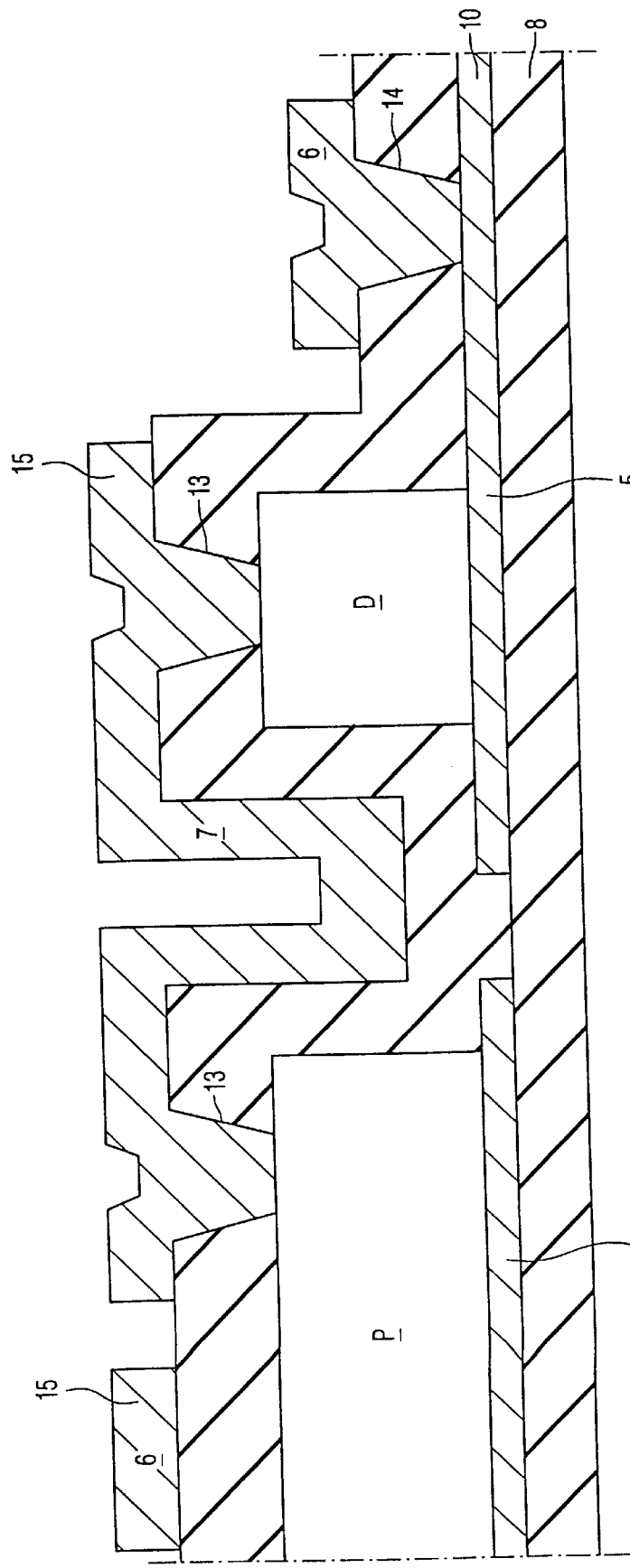
FIG. 3 shows a cross section along the line 3—3 in FIG. 1.

The processes by which the pixel configuration shown in FIG. 1 may be produced, and some examples of the possible materials to be used, will now be described. The full process steps will not be described in detail, since those skilled in the art will appreciate the various possibilities. Reference should be made to FIGS. 2 and 3, which show the cross sections taken along the lines II—II and III—III respectively, in FIG. 1.

The pixels 2 are provided on a common substrate 8, for example a glass substrate. The row conductors 4 are provided over the substrate 8, for example in the form of chromium or other metal tracks. This is achieved by depositing a metal base layer 10 over the entire substrate 8, for example by a sputtering process, and subsequently wet etching the layer to form the tracks which define the row conductors 4. At the same time, base contacts 5 (see FIG. 1) are defined for the switching diodes D.

The photodiode P of each pixel is disposed over the row conductor 4 and comprises amorphous silicon layers defining a photodiode structure. For example, the photodiode may comprise an n-type semiconductor layer Pn disposed over the row conductor 4, an intrinsic semiconductor layer Pi disposed over the n-type layer, and a p-type semiconductor layer Pp disposed over the intrinsic semiconductor layer.

The amorphous silicon layers of the photodiode P are defined by deposition over the base metal layer 10, for example using a PECVD process. The amorphous silicon layers which define the photodiodes P also define the switching diodes D, but as will be apparent from the following description, the switching diodes D are shielded from incident light to remove their photosensitivity. The array is subjected to a dry etching process which then removes portions of the amorphous silicon layers so as to define the photodiode P and switching diode D structures. The photodiodes P occupy a maximum area within the row, and the switching diodes D are restricted to the smallest practical size. The switching diodes D are formed over the base contacts 5 and are thereby isolated from each other and from the photodiode layers.

A passivation layer 12, for example of silicon nitride, is then deposited over the entire array, to passivate the edges of the diode stacks. This is particularly important for the photodiodes P. The passivation layer is patterned to provide contact holes 13 into the top of each switching diode and into the top of the shared photodiode (a contact hole being provided for each pixel area), so that the two diode structures may be interconnected. Contact holes 14 are also provided over the switching diode base contacts 5. A final top metal layer 15 is deposited over the array and patterned to define interconnections 7 between the switching diodes D and photodiodes P, and to define the column conductors 6. The interconnections 7, which overlie the switching diodes D, act as light shields for the switching diodes D, so that they do not display light-responsive characteristics.

The processing required to form the array shown in FIGS. 1 to 3 requires four masking steps. These are; a first mask to define the metal row conductors 4 and contact pads 5 for the switching diodes D, a second mask to etch the amorphous silicon layers to define the photodiode and switching diode areas, a third mask to pattern contact holes into the passivation layer, and a fourth mask to define the column conductors 6 and diode interconnections 7.

In comparison with discrete isolated pixels, the structure shown in FIGS. 1 to 3 increases the area of each pixel occupied by the light receiving photodiode surface, and also reduces the number of diode stack edges where edge leakage currents can be generated. However, the passivation layer 12 cannot eliminate edge leakage currents flowing down the edges of the pixel stack. Furthermore, the positioning of the switching diodes and the photodiodes over separate portions of the substrate results in some loss in the possible light collecting area for each pixel.

In order to eliminate substantially the edge leakage currents, it is possible to provide a photodiode structure with at least one layer shared between all pixels of the array, as will be apparent from the embodiments described below.

To improve the light collecting area, a stacked pixel structure may be provided, wherein, in the case of a diode-diode pixel, the photodiode and the switching diode overlie one another over the substrate. The problem then arises that the switching diode structure is also shared between pixels, so that selective etching is required to provide individual switching diodes. Backillumination is also required, otherwise the switching diodes shield light from the photodiodes. The switching diodes can not be transparent, otherwise they would become responsive to the incident light, which would alter the switching characteristics of the pixels.

Although a stacked switching diode-photodiode pixel can be envisaged, with the photodiode shared between rows of pixels, or between all pixels of the array, a preferred arrangement relies upon a stacked photodiode-capacitor pixel arrangement, wherein each pixel comprises a photodiode and a charge storage capacitor connected in series between a respective row and column conductor. This arrangement is shown in FIG. 4 in plan view, with photodiode layers shared between all pixels of the array.

The operation of a photodiode-capacitor will be known to those skilled in the art. One particular advantage is the possibility of providing a transparent capacitor layer, as will be apparent from the following description.

Figure 4:
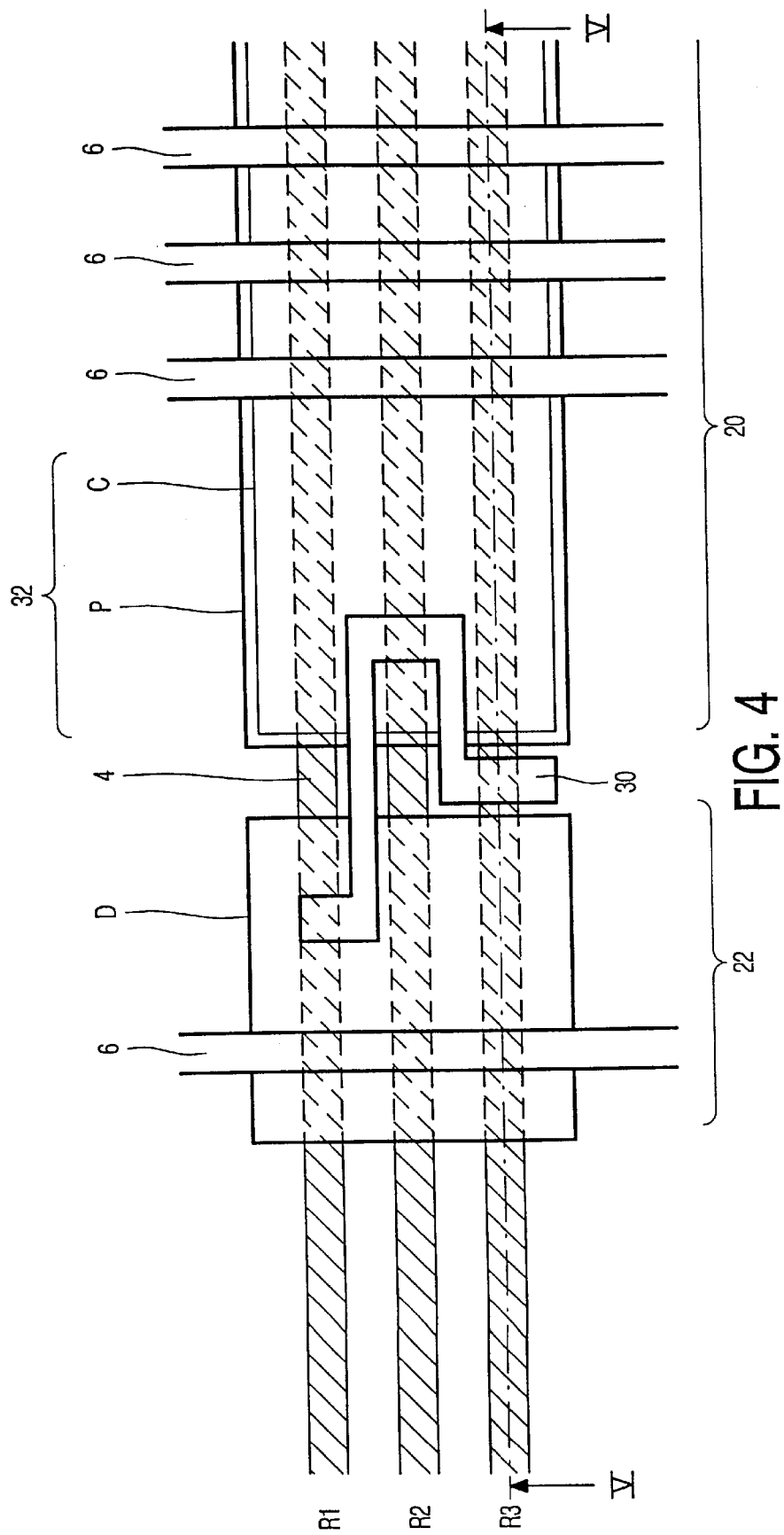
FIG. 4 shows a plan view of an alternative embodiment of image sensor according to the invention.

In FIG. 4, the pixel area 20 and the peripheral circuitry area 22 of the array have both been shown. The pixel area 20 again comprises row conductors 4 disposed over the common substrate. In the embodiment of FIG. 4, the semiconductor layers of the photodiode P are shared between all pixels of the array. Thus, the pixel area 20 comprises the row conductors 4 disposed over the substrate, the amorphous silicon layers defining the photodiode P forming a continuous layer over the rows 4, and a capacitor dielectric layer C over the photodiode layers, which is contacted by the column conductors 6. The capacitor dielectric layer C is not present in the peripheral circuitry area 22, so that diode-based circuits may be fabricated using the same layers as used to fabricate the pixel array.

The provision of a continuous semiconductor diode structure requires measures to ensure that pixel signals remain substantially isolated. Various arrangements are possible to provide this isolation, and some of the various possibilities will be described in the following.

Figure 5:
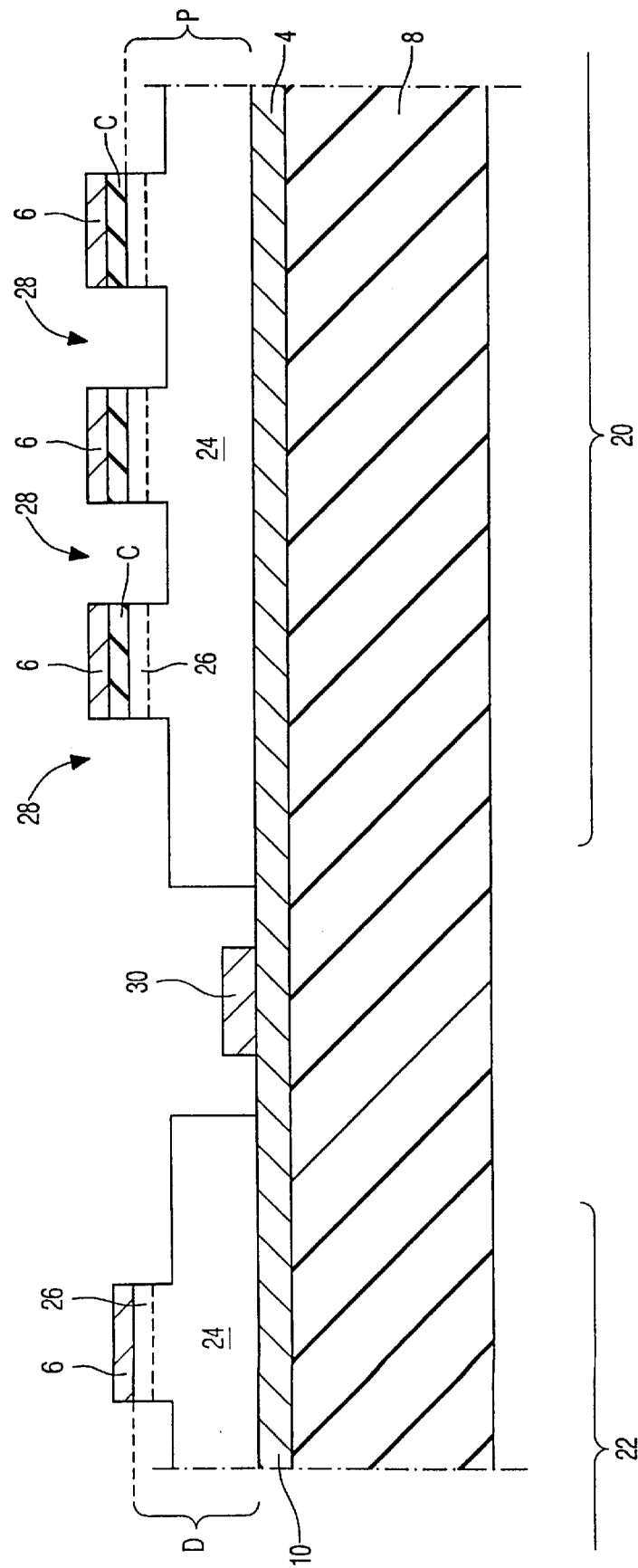
FIG. 5 shows the cross section of 5—5 in FIG. 4.

FIG. 5 shows a cross section along the line V—V in FIG. 4, and represents a preferred construction of the pixel array. In this preferred embodiment, the row conductors 4 are defined from a chromium nitride layer, which is deposited and patterned using a known photolithographic and etching process. After the chromium nitride has been etched to form the desired pattern of row conductors, the chromium nitride is then exposed to an RF glow discharge of $PH_3$ (phosphine). As a result of this phosphine plasma exposure, phosphorous dopant is adhered to the surface of the chromium nitride pattern, but not significantly to the glass substrate.

The subsequent photodiode layers then comprise only an intrinsic amorphous semiconductor layer 24 disposed over the doped chromium nitride conductors, and a p-type semiconductor layer 26 over the intrinsic layer. During the deposition of the intrinsic semiconductor layer 26, n-type regions are formed in the amorphous silicon film adjacent the chromium nitride patterns by phosphorus diffusion from the surface of the chromium nitride. Consequently, regions of negatively doped amorphous silicon are formed in the intrinsic semiconductor layer without the need for any etching to define separate islands of negatively doped semiconductor material. The two amorphous silicon layers are deposited over the entire array, by known techniques, and coarse patterning may be employed (for example using a proximity printer) to define discrete pixel array and peripheral circuitry portions over the array. A spacing is preferably left between the pixel array and the peripheral circuitry, as shown in FIG. 4.

Thus, as shown in FIG. 5, the chromium nitride base metal layer 10, which defines the row conductors 4, is covered directly by the intrinsic semiconductor layer 24 of the photodiode structure P. The local n-type doping in the intrinsic layer 24 adjacent the chromium nitride row conductors 4 is not shown.

The intrinsic layer 24 and the p-type layer 26 together define the photodiode structure P, and a capacitor dielectric C is deposited over the p-type layer 26, with no intermediate conducting junction. The capacitor dielectric layer C is, for example, hydrogenated silicon nitride and coarse patterning may again be employed to remove the capacitor, dielectric from the peripheral circuitry area of the substrate. Alternatively a mechanical mask may prevent deposition of the dielectric layer C over the peripheral circuitry portion of the substrate.

Finally, the top metal conductor is deposited and patterned using conventional deposition and lithography techniques. For example, the top metal layer 14 may be a layer of indium tin oxide (ITO), which enables the capacitor and top contact to be transparent, enabling illumination of the image sensor pixel from above the substrate. ITO may be wet etched to define the column conductors.

In FIG. 5, the p-type semiconductor layer 26 and capacitor dielectric C are shown to be etched to define stacks beneath the column conductors 6. The column conductors 6 may be used as a mask for a dry etching process which removes the silicon nitride dielectric C of the capacitor and the p-type semiconductor layer 26. Furthermore, this dry etching process may be carried out to etch partially into the intrinsic semiconductor layer 24, defining channels 28 as shown in FIG. 5. In this way, individual isolated p-type semiconductor regions are provided for each column of pixels, but the remaining portion of the intrinsic semiconductor layer 24 prevents edge leakage effects occurring between the n-type semiconductor regions and the p-type semiconductor layer 26.

The process described above relies upon two accurate masking and etching stages; a first to define the row conductors, and a second to define the column conductors. Consequently, the number of critical processing stages required to produce the array is significantly reduced. Furthermore, the overall number of mask steps to produce the array is also reduced, since there is no need for a patterned silicon nitride (or other) passivation layer.

As described above, there is no metal contact layer provided between the photodiode P and the capacitor C of each pixel. Consequently, although the p-type semiconductor layer 26 and the capacitor dielectric C are shared between all pixels within a column, the interference between charge signals stored on the capacitor C of each pixel in a column can be ignored, as a result of the very high lateral resistance of the p-type semiconductor layer 26. Indeed, as a result of this high resistance, it is not in fact necessary to etch beneath the column conductor 6 into the p-type semiconductor layer 26, and the capacitor dielectric C. Furthermore, although the doped row conductors 4 define row-shaped n-type semiconductor regions in the base of the intrinsic semiconductor layer 24, a conventional n-i-p diode structure may be deposited over the entire array over conventional chromium bottom metal contacts.

The arrangement of the capacitor layers over the photodiode layers in the pixel arrangement shown in FIGS. 4 and 5 is required to enable doped conductors to form the n-type semiconductor layers of the photodiode structure. However, the capacitor dielectric layer may instead be provided over the substrate over the row conductors, and conventional photodiode layers (n-i-p or p-i-n) may be deposited over the capacitor dielectric.

The embodiment shown in FIGS. 4 and 5 also enables interconnections to be made between diodes in the peripheral circuitry 22. For this purpose, as mentioned above, an area is provided between the pixel array 20 and the peripheral circuitry area 22 which does not have semiconductor diode layers. This area enables contacts to be made to the row conductors 4. An example is shown in FIG. 4 in which row R1 is to be connected to row R3 through a peripheral circuitry diode. The top metal layer, which defines the column conductors 6, also defines a connecting track 30 which directly overlies row R3. In order for the connecting track 30 to jump over row R2 to enable contact with the top of a diode over row R1, the connecting track 30 extends parallel to, and between, the row conductors 4 to a connecting region 32 of the pixel array. The connecting track 30 passes over the row conductor R2 and is insulated from it by the remaining portion of the intrinsic semiconductor layer 24 which covers the connecting portion 32 of the pixel array. The connecting track 30 may then run parallel to, and between, the row conductors 4 and back to the peripheral circuitry area 22 to make contact with the top of a diode stack above row R1. Connections of this type are required to implement circuitry using the diodes in the peripheral circuitry area 22, and the arrangement described above provides a simplified interconnection between diodes in the peripheral circuitry.

As described above, the top metal contacts, defining the column conductor 6 and connecting tracks 30 are preferably transparent for an image sensor illuminated from above the substrate. One problem which may be encountered when using transparent ITO as the top metal contact is the problem of step coverage as the ITO steps over the edges of the semiconductor areas of the array. This step coverage problem may be encountered with the connecting tracks 30 or with the column conductors 6 at the outer edges of the array. One solution to this problem is to taper the edges of the semiconductor layers, and this is possible using a wet etching process when defining the pixel array 20 and peripheral circuitry area 22. An alternative is to avoid the use of ITO top conductors, which are prone to step coverage problems, by relying upon back-illumination, and placing the ITO columns directly over the substrate, thereby effectively inverting the entire structure. It is possible to dope ITO conductors to provide doped semiconductor regions in the intrinsic layer, and such a technique is described in the conference paper "An Ohmic Contact Formation Method for Fabricating α-Si TFTs on Large Size Substrates", Yukawa et al, published in Proceedings of the 9th International Display Research Conference, Oct. 16–18 1989, Kyoto, Japan, Japan Display '89 pages 506–509. It is furthermore possible to provide p-type doping by adhering boron ions to the ITO conductors. In this case, the top contacts comprise the row conductors, which no longer need to be transparent for a back-illuminated image sensor, and they may therefore be formed from chromium and/or aluminum which can be deposited without step coverage problems.

The technique of doping the bottom metal conductors as described with reference to FIGS. 4 and 5 may, of course equally be applied to the embodiment of FIGS. 1 to 3, and conversely the three discrete layer diodes of FIGS. 1 to 3 may be employed in the embodiment of FIGS. 4 and 5. The use of doped conductors giving rise to doping of the bottom of the photodiode structure may also be employed to fabricate p-i-n diodes if boron, or other acceptor ions, are associated with the metal conductors over the substrate.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. An image sensor comprising:
    an array of photoresponsive pixels provided on a common substrate, each pixel comprising a photodiode having a first semiconductor region of first doping type;
    an intrinsic semiconductor region over the first semiconductor region, and a second semiconductor region of second, opposite, doping type, over the intrinsic semiconductor region, wherein the intrinsic semiconductor region extends between photodiodes within a group of pixels.

2. An image sensor as claimed in claim 1, wherein each pixel comprises a switching diode and a photodiode, with the switching diode and photodiode occupying separate areas over the substrate.

3. An image sensor as claimed in claim 2, wherein the pixels are arranged in rows and columns, a plurality of groups of pixels being provided, each group of pixels comprising a respective row of pixels, and wherein the first and second semiconductor regions also extend between photodiodes within each row of pixels.

4. An image sensor as claimed in claim 1, wherein the intrinsic semiconductor layer extends between the photodiodes of all pixels of the array.

5. An image sensor as claimed in claim 4, wherein the pixels are arranged in rows and columns, the second semiconductor region of the photodiodes of one column being separate from the second semiconductor region of the photodiodes of each other column.

6. An image sensor as claimed in claim 5, wherein the intrinsic semiconductor region is partially etched so that an upper portion of the intrinsic semiconductor region is patterned to correspond to the second semiconductor regions, and a lower portion of the intrinsic semiconductor region extends between the photodiodes of all pixels of the array.

7. An image sensor as claimed in claim 5, wherein each pixel comprises a bottom contact, the photodiode being disposed over the bottom contact, and a capacitor disposed over the photodiode, the capacitor having the same shape as and overlying the second semiconductor region, and comprising a dielectric layer disposed over the second semiconductor region of each pixel and a top contact layer over the dielectric layer.

8. An image sensor as claimed in claim 7, wherein a pixel area and a peripheral circuitry area are provided over the substrate, the capacitors being formed only over the pixel area.

9. An image sensor as claimed in claim 8, wherein an area is provided between the pixel area and the peripheral circuitry area without photodiode or capacitor layers, which enables access to the bottom contacts, and wherein the top contact layer defines connections between diodes in the peripheral circuitry.

10. An image sensor as claimed in claim 1, wherein the photodiode comprises an intrinsic amorphous silicon layer disposed over a doped bottom conductor, the doped conductor thereby forming regions of the first doping type into the intrinsic layer, and a semiconductor layer of the second doping type over the intrinsic semiconductor layer.

* * * * *